United States Patent [19]

Tsai

[11] Patent Number: 5,012,213
[45] Date of Patent: Apr. 30, 1991

[54] PROVIDING A PGA PACKAGE WITH A LOW REFLECTION LINE

[75] Inventor: Chi-Taou Tsai, Chandler, Ariz.

[73] Assignee: Motorola, Inc., Schaumburg, Ill.

[21] Appl. No.: 452,488

[22] Filed: Dec. 19, 1989

[51] Int. Cl.⁵ ............................................. H01P 5/00
[52] U.S. Cl. ...................................... 333/247; 357/74; 361/403; 361/421
[58] Field of Search ................. 333/33, 238, 246, 247; 361/403, 404, 408, 421; 324/158 P; 174/52.4; 357/74, 80

[56] References Cited

U.S. PATENT DOCUMENTS

| | | | |
|---|---|---|---|
| 4,513,355 | 4/1985 | Schroeder et al. | 361/403 |
| 4,580,193 | 4/1986 | Edwards | 361/403 X |
| 4,593,243 | 6/1986 | Lao et al. | 333/238 X |
| 4,853,624 | 8/1989 | Rabjohn | 324/158 P |
| 4,907,129 | 3/1990 | Shimizu | 361/421 |

Primary Examiner—Paul Gensler
Attorney, Agent, or Firm—Joe E. Barbee

[57] ABSTRACT

A conventional pin grid array package is provided with microwave frequency signal lines by wire bonding two adjacent conductive lines together. The wire bonding process is done at the same time that a semiconductor device is electrically connected to the pin grid array package. The two adjacent wire bonded conductive lines will have very low reflection or signal loss and therefore can be used with signals having a fast rise time or fast edge rates. The wire bond connection does not significantly degrade a constant impedance line for the signal.

6 Claims, 1 Drawing Sheet

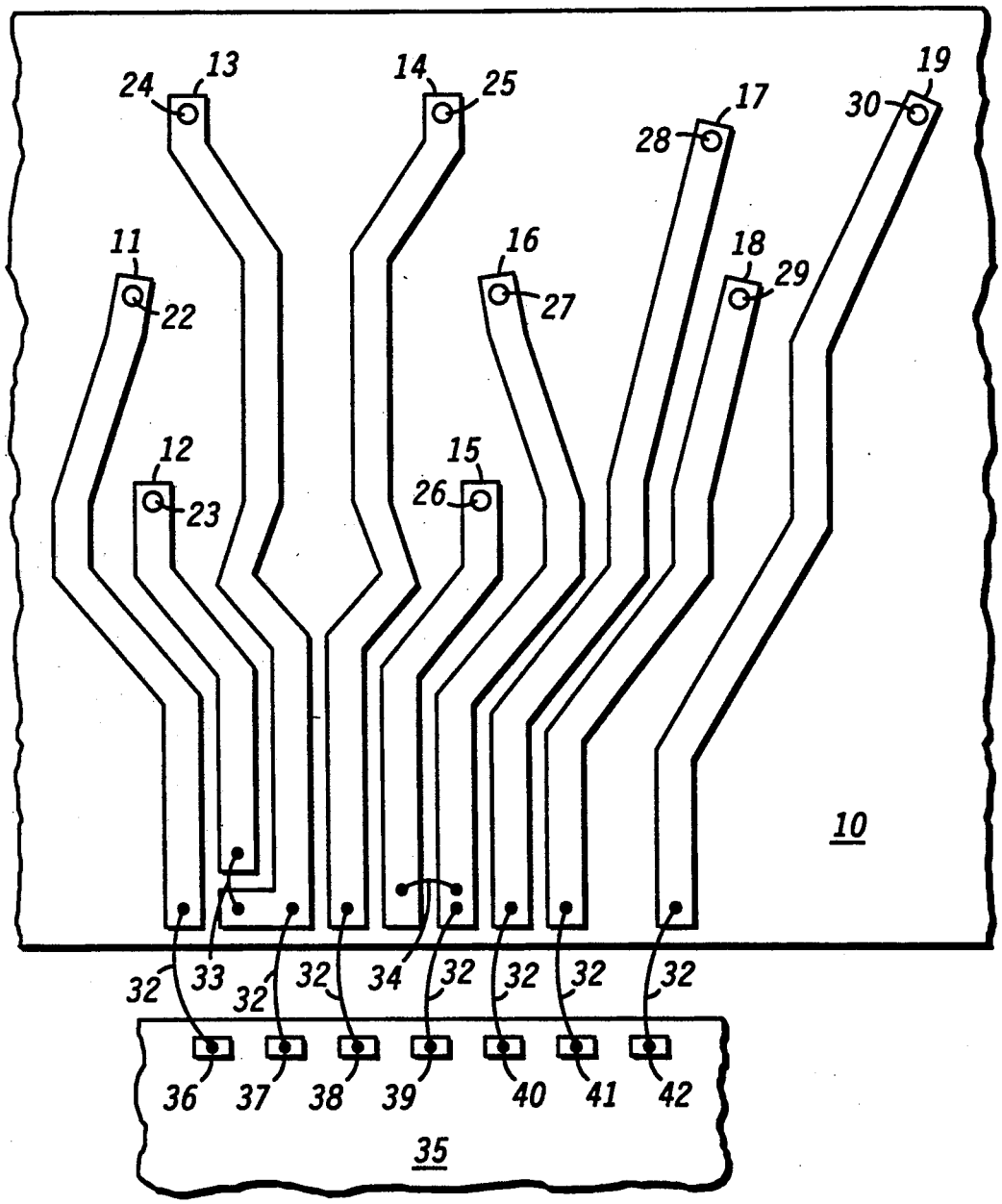

PROVIDING A PGA PACKAGE WITH A LOW REFLECTION LINE

BACKGROUND OF THE INVENTION

The present invention relates, in general, to pin grid array (PGA) packages for integrated circuits, and more particularly, to a pin grid array package which is easily provided with a low reflection line.

Pin grid array packages are widely used in packaging very large scale integrated circuits. One such pin grid array package is disclosed in U.S. Pat. No. 4,513,355 which issued on Apr. 23, 1985 to Schroeder et al. This U.S. Patent (U.S. Pat. No. 4,513,355) is hereby incorporated herein by reference. A PGA package has a plurality of terminals, or pins, which are arranged in a grid on a substrate. Usually the substrate is a multi-layer sandwich of dielectric material and patterned metal layers. The substrate usually has a centrally located opening in which an integrated circuit is mounted. Conductive lines electrically couple the PGA package pins with the integrated circuit. Because multiple layers of metal were used in the PGA package, the conductive lines formed a stripline conductor, wherein the conductive lines were sandwiched between two ground planes and isolated from the ground planes by a layer of dielectric material. The stripline conductors are also called signal lines, or transmission lines. The stripline conductor design reduces signal distortion as a signal travels from the package to the integrated circuit, but due to the difficulties in adding terminating resistors the stripline conductors were not terminated, which resulted in large reflection voltages when signals had fast edge rates.

To achieve higher operating frequencies, clock signals and data signals must have faster edge rates. To minimize distortion, signals having fast edge rates are conducted external to the semiconductor package on signal lines having a constant characteristic impedance $Z_0$, which is usually 50 ohms, and the signal lines are terminated with an impedance which matches the signal line. This is because when a signal having a fast edge rate is transmitted on a signal line with variable impedance, or which is not terminated with a matched impedance, at each impedance mismatch a portion of the signal is reflected toward the signal source, and a portion is transmitted forward on the signal line. The magnitude of the reflective voltage is a function of the edge rate of the signal and the capacitance of the transmission line termination. The terminating resistance is coupled between the signal line and ground reference or a negative or positive power supply. A signal is coupled to a receiving gate, also called a receiving line, of an integrated circuit by a branch signal line coupled to the terminated transmission line. Unterminated signal lines which branch from a terminated transmission line will also cause reflected voltages, the magnitude of which is a function of signal edge rate and capacitance of the unterminated branch.

Reflected signals from the PGA package signal line caused several problems. First, the wave shape of the signal that reached the receiving gate was distorted because part of the signal had been reflected, resulting in slower rise times and lower operating frequency. Second, the reflected portion of the signal appeared as noise on the external signal line, reducing the noise margin of data on that line. Third, the reflected wave caused standing waves in the signal line, which caused the signal amplitude to increase and decrease depending on capacitance of the package and signal frequency, further reducing the noise margin. All of these problems were aggravated when signal edge rates increased. Eventually the receiving gate did not operate reliably because of the reduced noise margin.

A solution to this problem was proposed in co-pending U S. patent application Ser. No. 374,791, filed July 3, 1989 by Prioste et al. This patent application, incorporated herein by reference, discloses a pin grid array package having dedicated low reflection signal lines which must be used for signals having fast edge rates. The low reflection lines provided by Prioste et al provide at least twice the system frequency bandwidth as compared with conventional PGA package traces or conductive lines. However, this approach requires that each special PGA package low reflection line requires two package pins that have to be designed and fabricated into the package. Because of the difference in the interconnect scheme for these special conductive lines as compared with conventional lines the packages become very customized to the specific applications and to the specific chips in the package. The number and location of these special low reflection lines are fixed once the packages have been designed and manufactured. Hence both chip design and system layout have to be tailored to the packages which may not always be cost effective.

Accordingly, an object of the present invention is to provide an improved PGA package which provides low reflection lines in a flexible manner.

Another object of the present invention is to provide a conventional PGA package having conductive lines which can readily be converted to low reflection lines.

A further object of the present invention is to provide a conventional PGA package capable of handling high speed microwave signals without substantially deteriorating the high speed microwave signals.

SUMMARY OF THE INVENTION

The above and other objects and advantages of the present invention are provided by interconnecting two adjacent conductive lines of a conventional pin grid array package. The adjacent conductive lines are interconnected by an electrically conductive wire. In a preferred embodiment the wire connection is made by wire bonding. One or more pairs can be interconnected to provide one or more low reflection signal lines in a given PGA package.

BRIEF DESCRIPTION OF THE DRAWING

The single FIGURE illustrates a very small portion of a PGA package illustrating an embodiment of the present invention.

DETAILED DESCRIPTION OF THE DRAWING

The single FIGURE illustrates a small portion of a pin grid array package 10 mated to a semiconductor integrated circuit 35. Those skilled in the art will be familiar with pin grid array packages as discussed hereinbefore and as shown in the U.S. Patent (U.S. Pat. No. 4,513,355) incorporated herein by reference.

PGA package 10 is a conventional package having a plurality of traces or conductive lines 11 through 19. The conductive lines or traces in PGA package 10 are said to have a controlled impedance because package 10 is a high frequency package and has ground (reference)

and power (voltage) planes. The electric field created by the ground and power planes almost eliminates any signal leakage. Each conductive line 11 through 19 is connected to a pin 22 through 30, respectively. Conductive lines 11 through 19 have an end near semiconductor device 35. Semiconductor device 35 has a plurality of contact pads 36 through 42. Contact pads 36 through 42 are illustrated as being wire bonded by wires 32 to respective conductive lines of PGA package 10. Contact pad 36 is wire bonded to conductive line 11, contact pad 37 is wire bonded to conductive line 13, contact pad 38 is wire bonded to conductive line 14, contact pad 39 is wire bonded to conductive line 16, contact pad 40 is wire bonded to conductive line 17, contact pad 41 is wire bonded to conductive line 18, and contact pad 42 is wire bonded to conductive line 19. The present invention provides wire bonds 33 and 34. Wire bond 33 connects conductive line 12 to conductive line 13 and wire bond 34 connects conductive line 15 to conductive line 16. Wire bonds 33 and 34 provide the electrical connections at the end of the conductive lines that are adjacent to semiconductor device 35.

Two arrangements for making wire bonds 33 and 34 are illustrated because some wire bond machines may not be able to make wire bond 34 between conductive line 15 and conductive line 16. This is because some wire bond machines can not make a wire bond which does not radiate out from the semiconductor device being wire bonded to. In those cases conductive lines can be arranged as is conductive line 13. Note that the end of conductive line 13 near semiconductor device 35 has an "L" configuration extending towards shortened conductive line 12. This permits wire bond 33 to be made in a radial direction from the central portion of semiconductor device 35 as are wire bonds 32.

The inductance of wire bonds 33 or 34 will be in the neighborhood of 1-2 nanohenrys. Typically the input capacitance of the high frequency active device of integrated circuit 35 is approximately ½ to 1 picofarad. Therefore the effective $Z_0$ is approximately 45 ohms with a delay of 40 picoseconds. This delay is small enough to not cause problems. Time domain reflectometer tests performed on the conductive line impedance for lines 12, 13 and 15, 16 showed a variation of plus or minus 4 to 8 ohms. This low variation is considered readily tolerable in high frequency applications. Furthermore, this approach offers the advantage of PGA package flexibility since any neighboring conductive lines can be wire bonded together to form a low reflection line. And as illustrated in the single figure, all of the conductive lines are shown to be on the same plane. However, as will be understood by those of skill in the art a PGA package typically has several layers of conductive lines and the present invention is equally applicable to the different layers or levels.

The present invention is applicable to any conventional PGA package with controlled impedance lines to achieve a high frequency signal path. In addition, this approach can be applied to any two neighboring traces or conductive lines, and therefore, there is no limitation on either the number or the location of the high frequency paths in the package. This approach is also well suited for gold ball-wedge bonding processes. In summary, the present invention achieves, in a conventional high frequency PGA package, high frequency, low reflection conductive lines or signal paths with maximum flexibility and chip/package/system design and layout. The conventional conductive lines of the PGA package do not have to be wire bonded until the package is mated to a semiconductor device. At this time all the wire bonding can be done. This approach eliminates the need to pick and choose PGA packages for individual semiconductor devices beforehand.

I claim:

1. A pin grid array package for effectively handling a fast rise time signal, comprising: the pin grid array package having a plurality of conductive lines, the plurality of conductive lines having ends terminating near an area for receiving a semiconductor device; a semiconductor device mounted in the area for receiving the semiconductor device, the semiconductor device having a plurality of contact pads, at least one of the contact pads being for a signal having a fast rise time; a plurality of wire bonds for electrically connecting the plurality of contact pads to the plurality of conductive lines, wherein one conductive line adjacent to a conductive line connected to the at least one fast rise time contact pad is not connected to a contact pad, and wherein the one conductive line as wire bonded to the adjacent conductive line to provide a low reflection line for the signal having a fast rise time.

2. A pin grid array package modified to provide at least one low reflection line for a fast rise time signal by the following steps: providing a plurality of conductive lines on the package wherein each of the conductive lines has an end terminating adjacent a semiconductor device mounting area; and using wire to electrically interconnect two adjacent conductive lines to provide the at least one low reflection line.

3. The pin grid array package of claim 2 wherein the using wire step comprises wire bonding the wire to make the electrical interconnect.

4. A pin grid array package wherein a low reflection line is easily provided, comprising: a plurality of electrically conductive lines in the package, each of the plurality of electrically conductive lines having an end near a semiconductor device mounting area; and a wire bond connection between two adjacent conductive lines to provide the low reflection line.

5. The pin grid array package of claim 4 wherein the pin grid array package is a high frequency pin grid array package having a ground and a power plane.

6. A method of converting two adjacent conductive lines of a pin grid array package to a low reflection line, comprising: wire bonding the two adjacent conductive lines together at an end adjacent a semiconductor device mounting area; and using the two wire bonded adjacent conductive lines as a low reflection line for a fast edge rate signal.

* * * * *